(12) United States Patent
Tsuruta

(10) Patent No.: US 10,981,471 B2
(45) Date of Patent: Apr. 20, 2021

(54) FUEL CELL SYSTEM, VEHICLE INCLUDING FUEL CELL SYSTEM, AND CONTROL METHOD OF FUEL CELL SYSTEM

(71) Applicant: TOYOTA JIDOSHA KABUSHIKI KAISHA, Toyota (JP)

(72) Inventor: Yoshiaki Tsuruta, Nagakute (JP)

(73) Assignee: TOYOTA JIDOSHA KABUSHIKI KAISHA, Toyota (JP)

( * ) Notice: Subject to any disclaimer, the term of this patent is extended or adjusted under 35 U.S.C. 154(b) by 108 days.

(21) Appl. No.: 16/292,574

(22) Filed: Mar. 5, 2019

(65) Prior Publication Data

US 2019/0275912 A1 Sep. 12, 2019

(30) Foreign Application Priority Data

Mar. 7, 2018 (JP) .............................. JP2018-040655

(51) Int. Cl.
| | |
|---|---|
| *B60L 58/40* | (2019.01) |
| *H01M 8/04858* | (2016.01) |
| *H01M 16/00* | (2006.01) |
| *G01R 31/382* | (2019.01) |
| *G01R 19/165* | (2006.01) |
| *B60L 58/12* | (2019.01) |

(52) U.S. Cl.
CPC ............... *B60L 58/40* (2019.02); *B60L 58/12* (2019.02); *G01R 19/16542* (2013.01); *G01R 31/382* (2019.01); *H01M 8/04925* (2013.01); *H01M 16/006* (2013.01)

(58) Field of Classification Search
CPC .................................. B60L 58/40; B60L 58/12
See application file for complete search history.

(56) References Cited

U.S. PATENT DOCUMENTS

2010/0136379 A1* 6/2010 King ..................... H02P 27/06
429/432
2015/0352962 A1* 12/2015 Hokoi ................... B60W 10/06
290/16

(Continued)

FOREIGN PATENT DOCUMENTS

| JP | 2002-141092 A | 5/2002 |
|---|---|---|
| JP | 2006-196221 A | 7/2006 |

(Continued)

*Primary Examiner* — Wyatt P McConnell
(74) *Attorney, Agent, or Firm* — Sughrue Mion, PLLC

(57) ABSTRACT

A fuel cell system includes: a fuel cell outputting generated power to an external load; a secondary battery outputting charged power to the external load; and a controller performing a first control that controls output power of the fuel cell and output power of the secondary battery such that the output power of the secondary battery has a ratio predetermined in accordance with an output demand from the external load, in the power supplied to the external load, the controller switches the first control to a second control when the output demand satisfies a predetermined condition with which the output power of the secondary battery is predicted to reach a limit value with the first control, the second control sets a target value of the output power of the fuel cell such that the output power of the secondary battery is smaller than that in the first control.

13 Claims, 10 Drawing Sheets

(56) References Cited

U.S. PATENT DOCUMENTS

2016/0009195 A1* 1/2016 Kazuno .................. B60L 53/20
                                                          701/22
2016/0141673 A1* 5/2016 Kakeno .................. B60L 1/003
                                                          429/9

FOREIGN PATENT DOCUMENTS

| JP | 2010-027328 A | 2/2010 |
| JP | 2010-244980 A | 10/2010 |

* cited by examiner

FUEL CELL SYSTEM, VEHICLE INCLUDING FUEL CELL SYSTEM, AND CONTROL METHOD OF FUEL CELL SYSTEM

CROSS REFERENCE TO RELATED APPLICATION

The present application claims priority to Japanese Patent Application No. 2018-040655 filed on Mar. 7, 2018 and the entire disclosure of which is incorporated herein by reference.

The present disclosure relates to a fuel cell system, a vehicle including the fuel cell system, and a control method of the fuel cell system.

A fuel cell system using output power from a fuel cell and output power from a secondary battery for outputting power demanded from an outside load is known. For example, Japanese Patent Application Publication No. 2006-196221 discloses a fuel cell system that controls distribution of output power from a fuel cell and a secondary battery such that system efficiency of the fuel cell system is improved.

In general, secondary batteries have a limit value of output power varying depending on temperature or a state of charge at that time. In fuel cell systems using output power of a secondary battery as described above, in order to achieve a high system efficiency, a secondary battery is controlled to output power of such a limit value in some cases. When power demanded from an external load increases while a secondary battery outputs such power close to a limit value, increase of output power of a secondary battery may not be obtained. In such a case, it is necessary to cope increase in demand power with only increase of output power of a fuel cell. However, in this case, due to time required for increasing a supply amount of reactant gas to a fuel cell, or the like, response time for the demand power may be delayed more than when secondary battery assists output. In fuel cell systems, there is a problem that, if output power of a secondary battery reaches a limit value, response for further demand of increasing supplying power from an external load may be delayed more than when the secondary battery is able to assist the output power.

SUMMARY

A first aspect is provided as a fuel cell system that supplies power corresponding to an output demand to an external load. The fuel cell system comprising: a demand detector detecting the output demand; a fuel cell generating power by receiving of reactant gas supply and outputting generated power to the external load; a secondary battery outputting charged power to the external load; and a controller configured to perform a first control and a second control, wherein (i) the first control controls output power of the fuel cell and output power of the secondary battery such that the output power of the secondary battery has a ratio predetermined in accordance with the output demand, in the power supplied to the external load, (ii) the second control sets a target value of the output power of the fuel cell such that the output power of the secondary battery is smaller than that in the first control, and the controller is configured to switch the first control to the second control when the demand detector detects the output demand satisfying a predetermined condition with which the output power of the secondary battery is predicted to reach a limit value with the first control during performing of the first control.

1. FIRST EMBODIMENT

Figure 1:
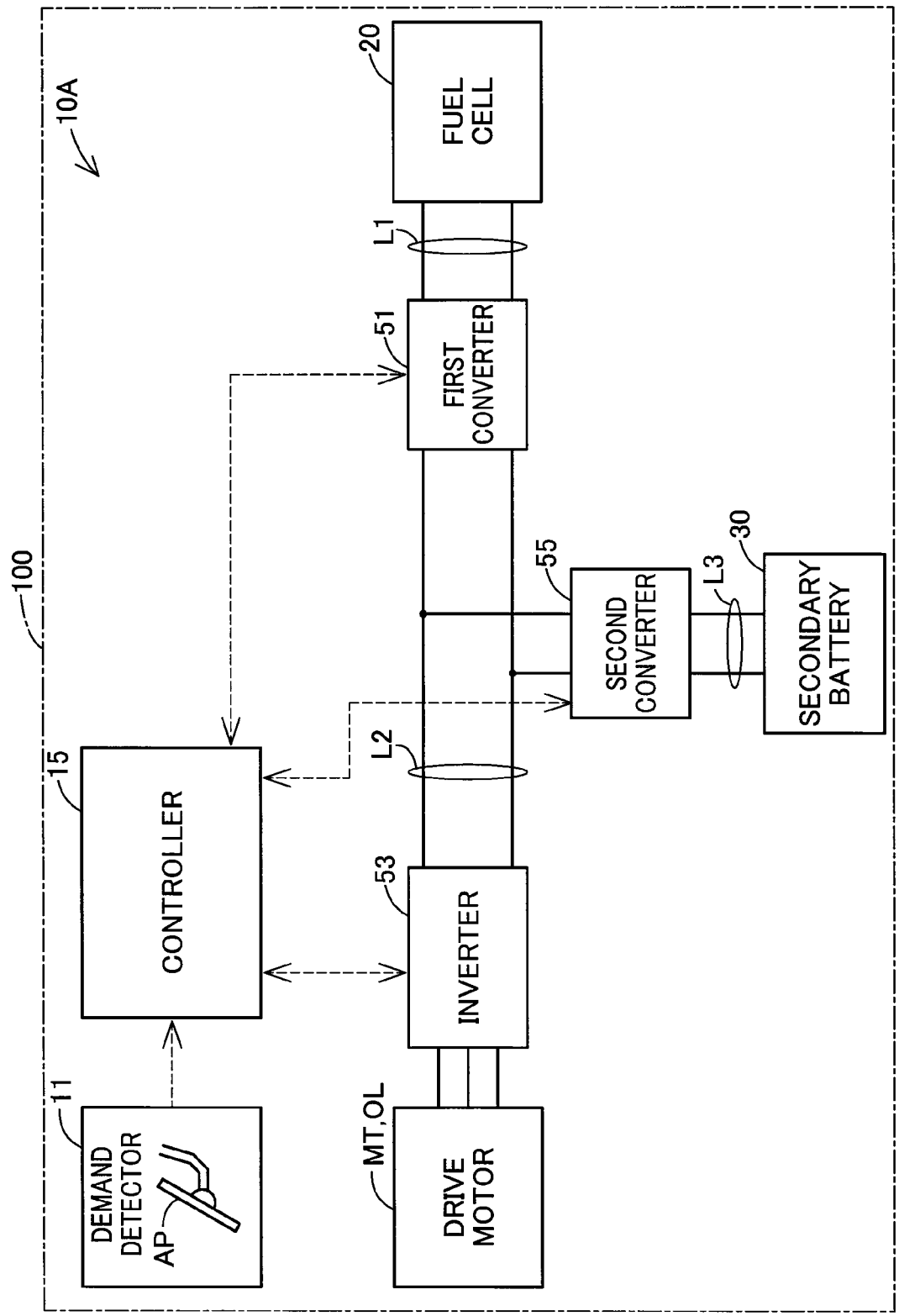
FIG. 1 is a schematic block diagram showing a configuration of a fuel cell system of the first embodiment.

FIG. 1 is a schematic block diagram showing a configuration of a fuel cell system 10A in a first embodiment. The fuel cell system 10A supplies power corresponding to an output demand to an external load OL. In the first embodiment, the fuel cell system 10A is mounted in a vehicle 100 that travels by drive force generated by a motor MT. The motor MT is one of an external load OL to which the fuel cell system 10A supplies power. In the first embodiment, the motor MT is configured with a three-phase AC motor. The fuel cell system 10A includes a demand detector 11, a controller 15, a fuel cell 20, and a secondary battery 30.

The demand detector 11 accepts an output demand to the fuel cell system 10A. In the first embodiment, the demand detector 11 includes an accelerator pedal AP that accepts an acceleration demand to the vehicle 100 from a driver. An opening of the accelerator pedal AP indicating an operation amount by the driver is input from the demand detector 11 to the controller 15 as an output demand for the fuel cell system 10A.

The demand detector 11 may accept the output demand from a controller of the vehicle 100 that automatically controls traveling of the vehicle 100, and input the output demand to the controller 15. The demand detector 11 may accept a power demand that the power is consumed in electrical components or auxiliary machines mounted in the vehicle 100 and input the power demand to the controller 15 as an output demand for the fuel cell system 10A from the external load OL. Note that the external load OL does not include auxiliary machines of the fuel cell system 10A.

The controller 15 controls the fuel cell system 10A. The controller 15 controls output power of the fuel cell 20 and output power of the secondary battery 30 in accordance with the output demand input from the demand detector 11 in operation control described later. The controller 15 is configured with a plurality of electronic control units (ECUs)

that exert different functions from each other. The ECU is configured with, for example, a computer including one or a plurality of processors and a main storage device. At least a part of the ECU may be configured with a plurality of electric circuits having various functions.

The fuel cell 20 generates power by receiving supply of fuel gas and oxidizing gas which are reactant gas. In the first embodiment, the fuel cell 20 is configured with a solid polymer fuel cell. The fuel cell 20 is not limited to a solid polymer fuel cell, and various types of fuel cells may be adopted. In other embodiments, as the fuel cell 20, instead of a solid polymer fuel cell, for example, a solid oxidant fuel cell may be adopted.

The fuel cell system 10A includes a reactant gas supply system that supplies reactant gas to the fuel cell 20 under control of the controller 15. The reactant gas supply system is not illustrated. In the first embodiment, details of the configuration of the reactant gas supply system is not described.

The secondary battery 30 is configured with, for example, a lithium ion cell. The secondary battery 30 outputs charged power under control of the controller 15. The controller 15 charges the secondary battery 30 by regenerative power generated in the motor MT and electric power generated in the fuel cell 20.

The fuel cell system 10A supplies the output power of the fuel cell 20 and the output power of the secondary battery 30 to the external load OL including the motor MT mounted in the vehicle 100, and auxiliary machines of the fuel cell system 10A. It is desirable that the fuel cell system 10A includes a first converter 51, an inverter 53, and a second converter 55 as components for controlling the output power of the fuel cell 20 and the secondary battery 30.

The first converter 51 is connected to the fuel cell 20 via a first wiring L1. The first converter 51 is connected to the inverter 53 via a second wiring L2. The inverter 53 is connected to the motor MT. The second converter 55 is connected to the second wiring L2. The second converter 55 is connected to the secondary battery 30 via a third wiring L3.

The first converter 51 is configured with a boost converter. The first converter 51 increases an output voltage of the fuel cell 20 that is input via the first wiring L1 and outputs the increased voltage to the second wiring L2. The controller 15 controls a duty ratio of the first converter 51 to control the voltage of the second wiring L2.

The inverter 53 converts a DC current input via the second wiring L2 into a three-phase AC current, and outputs the converted current to the motor MT. The controller 15 controls a frequency and a voltage of the three-phase AC current to be supplied to the motor MT by the inverter 53, and controls a rotation speed of the motor MT and a torque generated by the motor MT.

The second converter 55 is configured with a boost and buck converter. When outputting the power charged in the secondary battery 30 to the motor MT, the controller 15 causes the second converter 55 to increase the voltage of the third wiring L3 and output the increased voltage to the second wiring L2. When charging the secondary battery 30, the controller 15 causes the second converter 55 to reduce the voltage of the second wiring L2 and output the reduced voltage to the third wiring L3.

Figure 2:
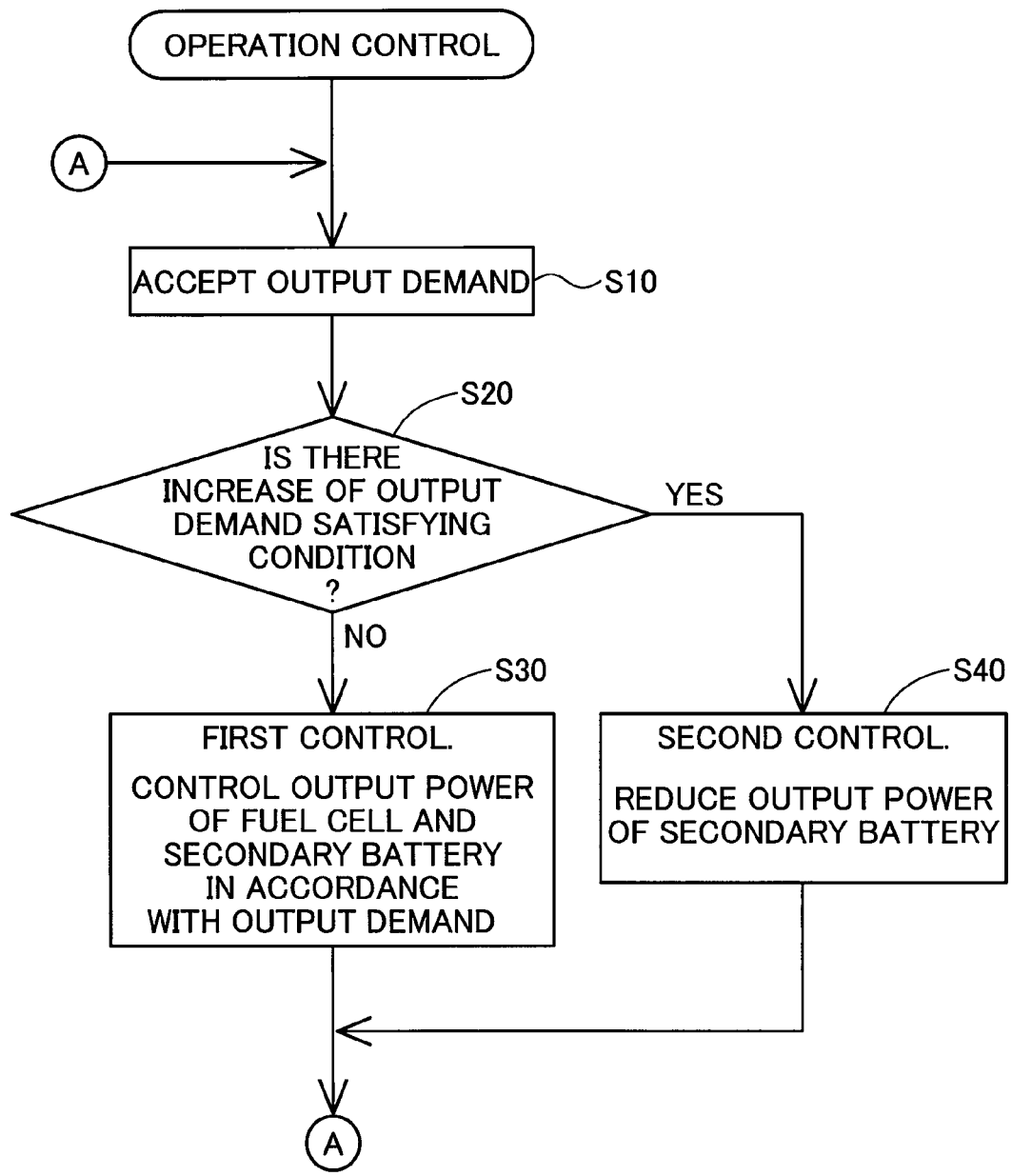
FIG. 2 is an explanatory diagram showing a flow of operation control in the fuel cell system of the first embodiment.

FIG. 2 is an explanatory diagram showing a flow of operation control in the fuel cell system 10A performed by the controller 15. The controller 15 repeatedly performs this flow of operation control during travelling of the vehicle 100.

In step S10, the controller 15 accepts an output demand for the fuel cell system 10A via the demand detector 11. The controller 15 calculates demand power that is a target value to be output by the fuel cell system 10A for the output demand.

In step S20, determination processing for switching first control and second control described alter is performed. In step S20, the controller 15 determines whether the output demand accepted is an output demand satisfying a predetermined condition with which the output power of the secondary battery 30 is predicted to reach a limit value described later when control is performed by the first control. In the first embodiment, the controller 15 determines whether the output demand is an output demand satisfying at least one of the following first condition and second condition.

The first condition is that, in the output demand, the magnitude of the demand power corresponding to the output demand is a predetermined first threshold or more. The first condition may be a condition that, in the output demand, the opening of the accelerator pedal is predetermined threshold or more. The second condition is that, in the output demand, an increase amount of the demand power per a unit time is a predetermined second threshold or more. The second condition may be a condition that, in the output demand, an increase amount of the opening of the accelerator pedal per a unit time is a predetermined threshold or more.

When both conditions of the first condition and the second condition are not satisfied, the controller 15 performs the first control of step S30. That is, when the magnitude of the demand power is less than the predetermined first threshold, and the increase amount of the demand power per a unit time is less than the predetermined second threshold, the controller 15 performs the first control of step S30.

On the other hand, when at least one of the first condition and the second condition is satisfied, the controller 15 performs the second control of step S40. That is, in the case of at least one of when the magnitude of the demand power is the predetermined first threshold or more, or when the increase amount of the demand power per a unit time is the predetermined second threshold or more, the controller 15 performs the second control of step S40.

In this way, in the fuel cell system 10A, for example, in an operation initial period in which the demand power starts increasing from 0, such as in a situation of low speed such as when the travelling of the vehicle 100 is just started, the first control of step S30 is performed. During preforming of the first control, when acceleration operation in which the demand power exceeds a threshold is performed, or when sudden acceleration operation in which an increase amount per a unit time of the demand power exceeds a threshold is performed, the control is switched from the first control to the second control of step S40.

In the first control of step S30, the controller 15 controls the output power of the fuel cell 20 and the output power of the secondary battery 30 in accordance with the output demand detected by the demand detector 11. The controller 15 determines a target value of the output power of the fuel cell 20 for the demand power with reference to a predetermined map. In order to output the power of the target value, for example, the controller 15 adjusts a supply amount of reactant gas, or the like, to control power generation of the fuel cell 20.

In the first control, the target value of the output power of the fuel cell 20 is determined to be the value of the demand power calculated in step S10 or less. The power corresponding to a difference between the demand power and the output power of the fuel cell 20 is compensated by the output power of the secondary battery 30. In the first control, due to the late supply of the reactant gas to the fuel cell 20, the power insufficient by the time when actual output power of the fuel cell 20 reaches the target value is also compensated by the output power of the secondary battery 30.

In the first control, in order to improve system efficiency of the fuel cell system 10A, it is desirable that the fuel cell system 10A is controlled such that the ratio of the output power of the secondary battery 30 in the power supplied to the external load OL is a value predetermined in accordance with the output demand. The "system efficiency of the fuel cell system 10A" corresponds to a ratio of an output power amount of the fuel cell system 10A for a consumption amount of the fuel gas in the fuel cell system 10A. The map for determining the target value of the output power of the fuel cell 20 described above is set in advance such that the target value of the output power of the fuel cell 20 that is smaller value for the demand power for the amount of the output power of the secondary battery 30 of the ratio is able to be obtained.

Figure 3:
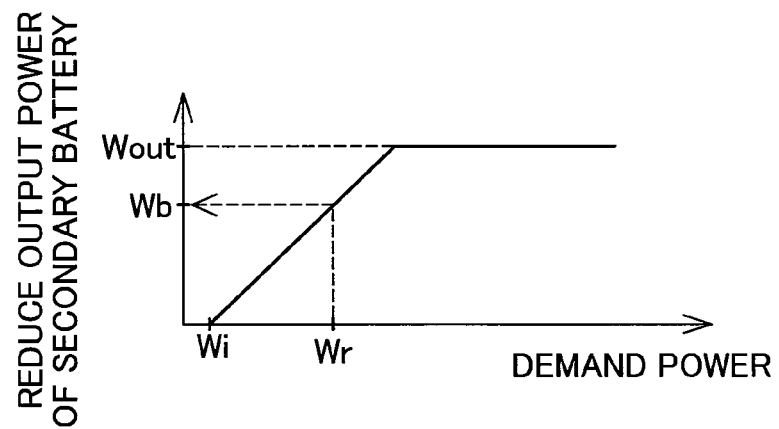
FIG. 3 is an explanatory diagram showing an example of relationship between demand power and output power of a secondary battery in first control.

FIG. 3 is an explanatory diagram showing an example of relationship between demand power Wr and output power Wb of the secondary battery 30 in the first control. In an example of FIG. 3, when the demand power Wr is Wi or smaller, the target value of the output power of the fuel cell 20 is determined such that the output power of the secondary battery 30 is 0. When the demand power Wr is larger than Wi, the target value of the output power of the fuel cell 20 is determined such that the output power Wb of the secondary battery 30 increases as the demand power Wr is larger.

However, after reaching a limit value Wout, the output power Wb of the secondary battery 30 does not exceed the limit value Wout even when the demand power Wr increases. The limit value Wout is the maximum value of the power that is capable of being physically output by the secondary battery 30 at the current time, and is a value that varies in accordance with a current state of the secondary battery 30. The limit value Wout varies, for example, in accordance with current temperature of the secondary battery 30, a current charging residual amount of the secondary battery 30, or the like.

As described above, the determination condition in step S20 is determined in advance so as to be satisfied when the output demand is an output demand with which the output power Wb of the secondary battery 30 is predicted to reach the limit value Wout in the first control. If the condition is determined in this way, in the first control, before the output power Wb of the secondary battery 30 reaches the limit value Wout, switching from the first control to the second control which is described below is performed. Thus, the output power Wb of the secondary battery 30 is prevented from reaching the limit value Wout, and a situation in which the output power from the secondary battery 30 is not able to be obtained is prevented.

In the second control of step S40, the controller 15 controls the output power of the fuel cell 20 and the output power of the secondary battery 30 such that the output power of the secondary battery 30 is smaller than that in the first control. In the first embodiment, the controller 15 controls such that the output power of the secondary battery 30 is reduced to 0. The controller 15 sets the target value of the output power of the fuel cell 20 to a value equal to the demand power for the fuel cell system 10A.

In the second control, irrespective of the magnitude of the demand output and the system efficiency, the output load of the secondary battery 30 is further reduced than that in the first control, and the control is performed in a direction of a state where remaining power of the secondary battery 30 is saved. Thus, even when a command of further increasing the demand power is issued thereafter, the output power of the secondary battery 30 is prevented from reaching the limit value, and support by the output power of the secondary battery 30 is prevented from not being obtained.

After the control is switched from the first control to the second control, when the demand power is less than the threshold in the first condition in step S20, and the increase amount per a unit time of the demand power is less than the threshold in the second condition, the controller 15 switches the control from the second control to the first control again. In this case, the secondary battery 30 is charged during decreasing of the load of the secondary battery 30 in the second control, so that the limit value Wout of the secondary battery 30 is increased. Thus, in the first control after switching from the second control, the output power Wb of the secondary battery 30 is prevented from reaching the limit value Wout.

Figure 4:
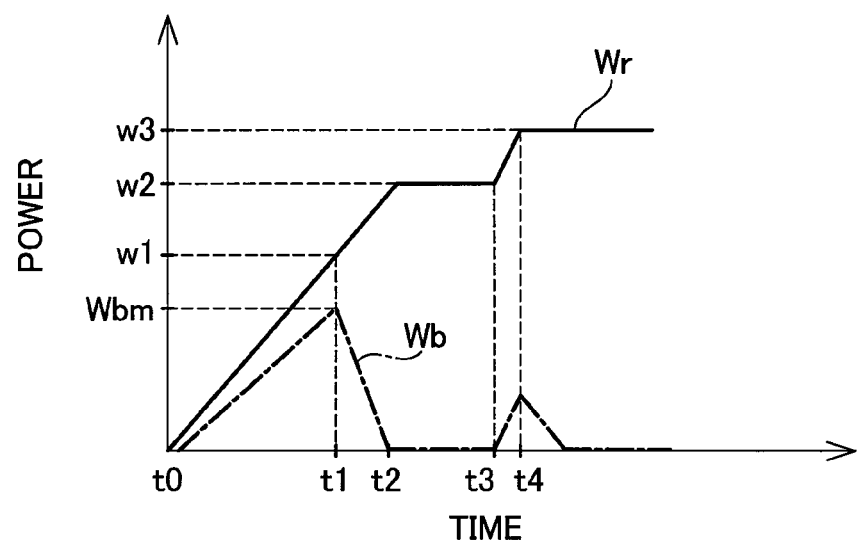
FIG. 4 is an explanatory diagram showing an example of time change of the output power of the secondary battery.

FIG. 4 is an explanatory diagram showing an example of time change of the output power Wb of the secondary battery 30 when control is switched from the first control to the second control. In FIG. 4, a graph of time change of the demand power Wr is indicated by a solid line, and a graph showing time change of the output power Wb of the secondary battery 30 for the time change of the demand power Wr is illustrated by a dot-and-dash line.

In an example of FIG. 4, after the operation control of the fuel cell system 10A starts at time t0, by time t1, as the first control is performed and the demand power Wr gradually increases, the output power Wb of the secondary battery 30 increases. At time t1, the demand power Wr reaches w1 corresponding to the threshold value of the determination condition in step S20, and the control is switched to the second control.

In the second control, the controller 15 sets the target value of the output power of the fuel cell 20 to the demand power Wr. As a result, as indicated in the period of times t1 to t2, by the time when the actual output power of the fuel cell 20 reaches the demand power Wr that is the target power, the output power Wb of the secondary battery 30 gradually reduces toward 0, and the load of the secondary battery 30 is reduced. Thereafter, a state where the demand power Wr is w2 larger than w1 continues, and while the second control continues, the output power Wb of the secondary battery 30 is maintained to 0, and the supply power to the external load OL is covered by the output power of the fuel cell 20.

At times t3 to t4, when the demand power Wr increases from w2 to w3, the controller 15 sets the target value of the output power of the fuel cell 20 to w3 that is the current demand power Wr. Immediately after time t3, due to time delay by reaching of the reactant gas of the target supply amount to the fuel cell 20, response delay of auxiliary machines related to the power generation control of the fuel cell 20, delay may occur in the time until when the output power of the fuel cell 20 reaches w3 that is the target value. In such a case, as indicated by times t3 to t4, the difference between the target value of the output power of the fuel cell 20 and the actual output power of the fuel cell 20 is compensated by the output power Wb of the secondary battery 30. Accordingly, the fuel cell system 10A is able to response to the increase of the output demand in the same manner as in the state where the output power of the secondary battery 30 have not reached the limit value in the first control.

In this way, according to the fuel cell system 10A of the first embodiment, in the first control, when there is a possibility that the output power of the secondary battery 30 reaches the limit value Wout, the control is switched from the first control to the second control, and control is performed in a direction in which a remaining power is able to be saved in the secondary battery 30. Thus, a state in which the support by the output power Wb from the secondary battery 30 is not capable of being obtained is established, and the response of the fuel cell system 10A for the output demand is prevented from being delay further than in the case where the support by the output power Wb from the secondary battery 30 is obtained. Accordingly, a state is prevented in which, when the driver of the vehicle 100 operates to accelerate, the support by the output power by the secondary battery 30 is not able to be obtained, so that the torque generation of the motor MT is delayed. As a result, so-called torque shock generated by a difference between the demand torque and the actual torque is prevented from being applied to the driver.

Figure 5:
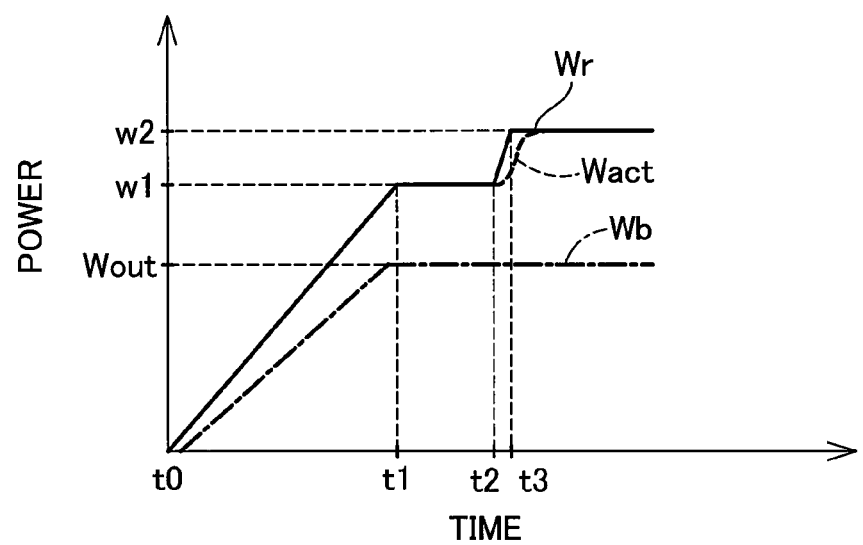
FIG. 5 is an explanatory diagram showing an example of generation of response delay of supply power in operation control of a comparative example.

Operation control as a comparative example with respect to the operation control of the first embodiment will be described with reference to FIG. 5. FIG. 5 is an explanatory diagram showing an example of generation of response delay for the increase demand of the supply power in operation control of a comparative example. In FIG. 5, as similar to FIG. 4, a graph of time change of the demand power Wr is indicated by a solid line, and a graph showing time change of the output power Wb of the secondary battery 30 for the time change of the demand power Wr is illustrated by a dot-and-dash line. In FIG. 5, the graph indicating time change of the actual output power Wact of the fuel cell system 10A at t2 and thereafter is illustrated by dotted line.

In this comparative example, the control is not switched to the second control, and irrespective of the magnitude of the demand power Wr, similar control to the first control is continuously performed. Thus, at time t1 in which the demand power Wr has increased to w1, the output power Wb of the secondary battery 30 reaches the limit value Wout. Irrespective of increase of the demand power Wr thereafter, the output power Wb of the secondary battery 30 is maintained to be the limit value Wout.

At times t2 to t3, the output demand of increasing the demand power Wr from w1 to w2 is performed. In the operation control of this comparative example, since the output power Wb of the secondary battery 30 has reached the limit value Wout, the support by the output by the secondary battery 30 is not able to be obtained. Thus, the amount of increase in the demand power Wr is coped with by increasing the output power of the fuel cell 20. However, when the output power of the fuel cell 20 is increased, the response delay described above may be generated. In this case, in the operation control of the comparative example, the increase in the actual output power Wact of the fuel cell system 10A is delayed with respect to the increase in the demand power Wr, and the response of the supply power is delayed more than when the secondary battery 30 is capable of assisting the output power. Thus, the torque generation of the motor MT with respect to the acceleration operation by the driver of the vehicle 100 is delayed more than that during the normal operation in which the support of the output power of the secondary power 30 is obtained, and the torque shock described above may be applied to the driver.

As described above, according to the control method realized in the fuel cell system 10A of the first embodiment and the operation control of the fuel cell system 10A of the first embodiment, when an output demand is detected with which there is a possibility that the output power of the secondary battery 30 reaches the limit value, switching is performed from the first control utilizing the output power of the secondary battery 30 to the second control saving remained power of the secondary battery 30. Thus, the output power Wb of the secondary battery 30 is prevented from reaching the limit value Wout, and the response delay for the increase demand of the supply power supplied to the external load OL, which is caused due to being incapable of obtaining the support by the output power Wb of the secondary battery 30, is prevented from generating.

In the first embodiment, when the magnitude of the demand power Wr is a predetermined threshold or more, switching from the first control to the second control is performed. As a result, the second control is started in advance before a high load state in which the demand power Wr is large is established in the first control and the output power Wb of the secondary battery 30 reaches the limit value Wout. In the first embodiment, when the increase amount of the demand power Wr per a unit time is a predetermined threshold or more, switching from the first control to the second control is performed. As a result, when the load of the secondary battery 30 increases due to sudden increase of the demand power Wr, and there is high possibility that the output power Wb of the secondary battery 30 reaches the limit value Wout, switching to the second control is performed in advance. In addition, in the first embodiment, when the magnitude of the demand power Wr is a predetermined threshold or more, and when the increase amount of the demand power Wr per a unit time is a predetermined threshold or more, two determination conditions of switching the control from the first control to the second control are used. Thus, the fuel cell system 10A is able to be further prevented from being in an operation state in which the output power Wb of the secondary battery 30 reaches the limit value Wout.

In the first embodiment, in the second control, in a state where the output power of the fuel cell 20 has reached the target value, the output power Wb of the secondary battery 30 is 0 and the load of the secondary battery 30 is minimized. In this configuration, when a secondary battery having a small cell capacity is adopted as the secondary battery 30, particularly, the output power Wb of the secondary battery 30 is effectively prevented from reaching the limit value Wout. Other than that, according to the fuel cell system 10A and the control method realized in the operation control of the fuel cell system 10A of the first embodiment, various operation and effects that have been described in the first embodiment is achieved.

2. SECOND EMBODIMENT

Figure 6:
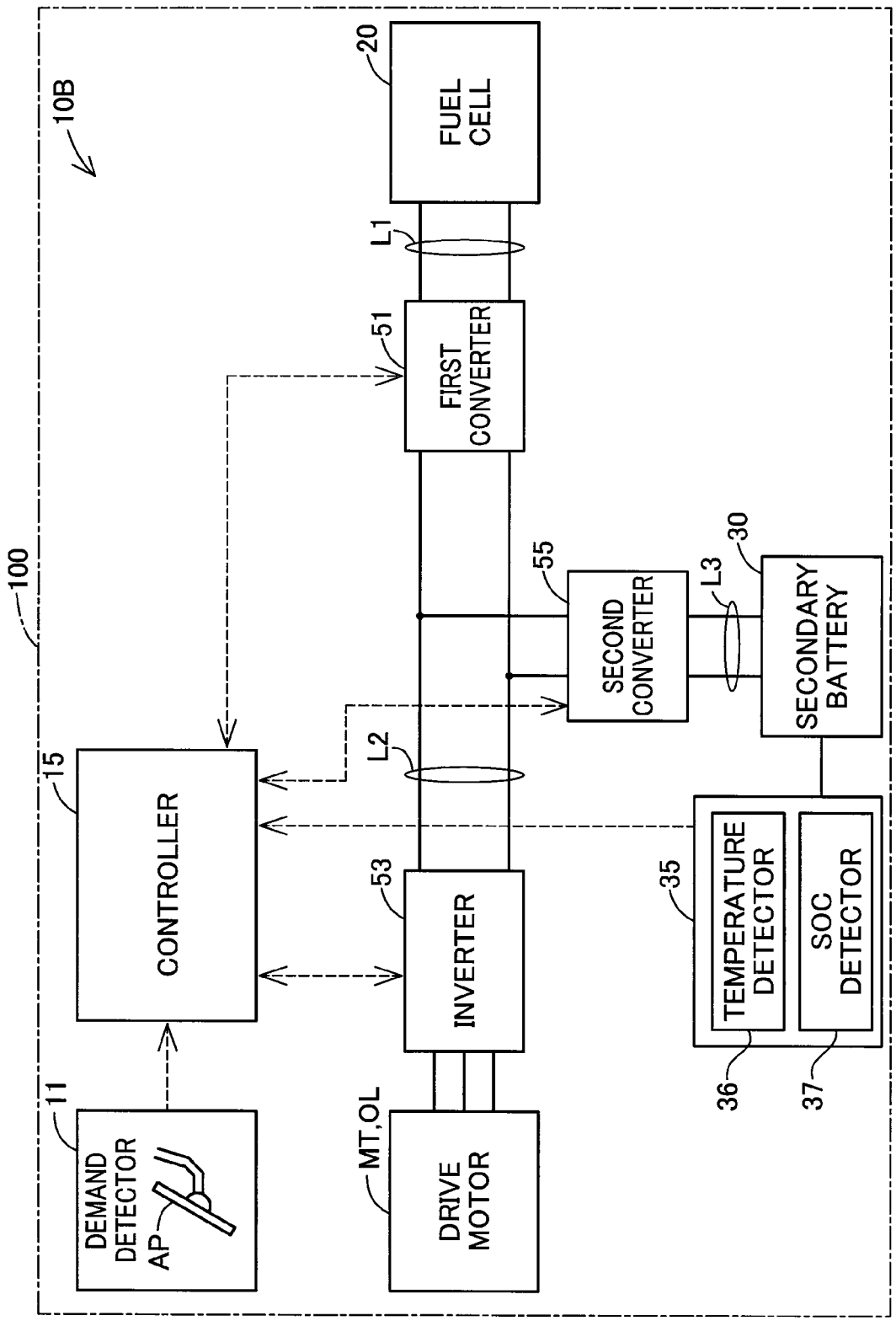
FIG. 6 is a schematic block diagram showing a configuration of a fuel cell system of a second embodiment.

FIG. 6 is a schematic block diagram showing a configuration of a fuel cell system 10B in a second embodiment. The fuel cell system 10B of the second embodiment is almost the same as the configuration of the fuel cell system 10A of the first embodiment except that the fuel cell system 10B includes a secondary battery state detection unit 35 for monitoring a current state of the secondary battery 30. The secondary battery state detection unit 35 monitors the current state of the secondary battery 30, and outputs information representing the current state of the secondary battery 30 to the controller 15. The secondary battery state detection unit 35 includes a temperature detector 36 and an SOC detection unit 37.

The temperature detector 36 detects the current temperature of the secondary battery 30 and outputs the current temperature to the controller 15. The temperature detector 36 is configured with, for example, a temperature sensor incorporated in the secondary battery 30. The SOC detection unit 37 detects the current state of charge of the secondary battery 30 and transmits the current state of charge to the controller 15. The SOC means a ratio of an accumulated power residual amount for an accumulated power capacity of the secondary battery 30. The SOC is obtained by, for example, integrating an accumulated power current and a discharge current. The SOC may be obtained on the basis of a secondary battery electrolyte specific gravity and a secondary battery voltage.

Figure 7:
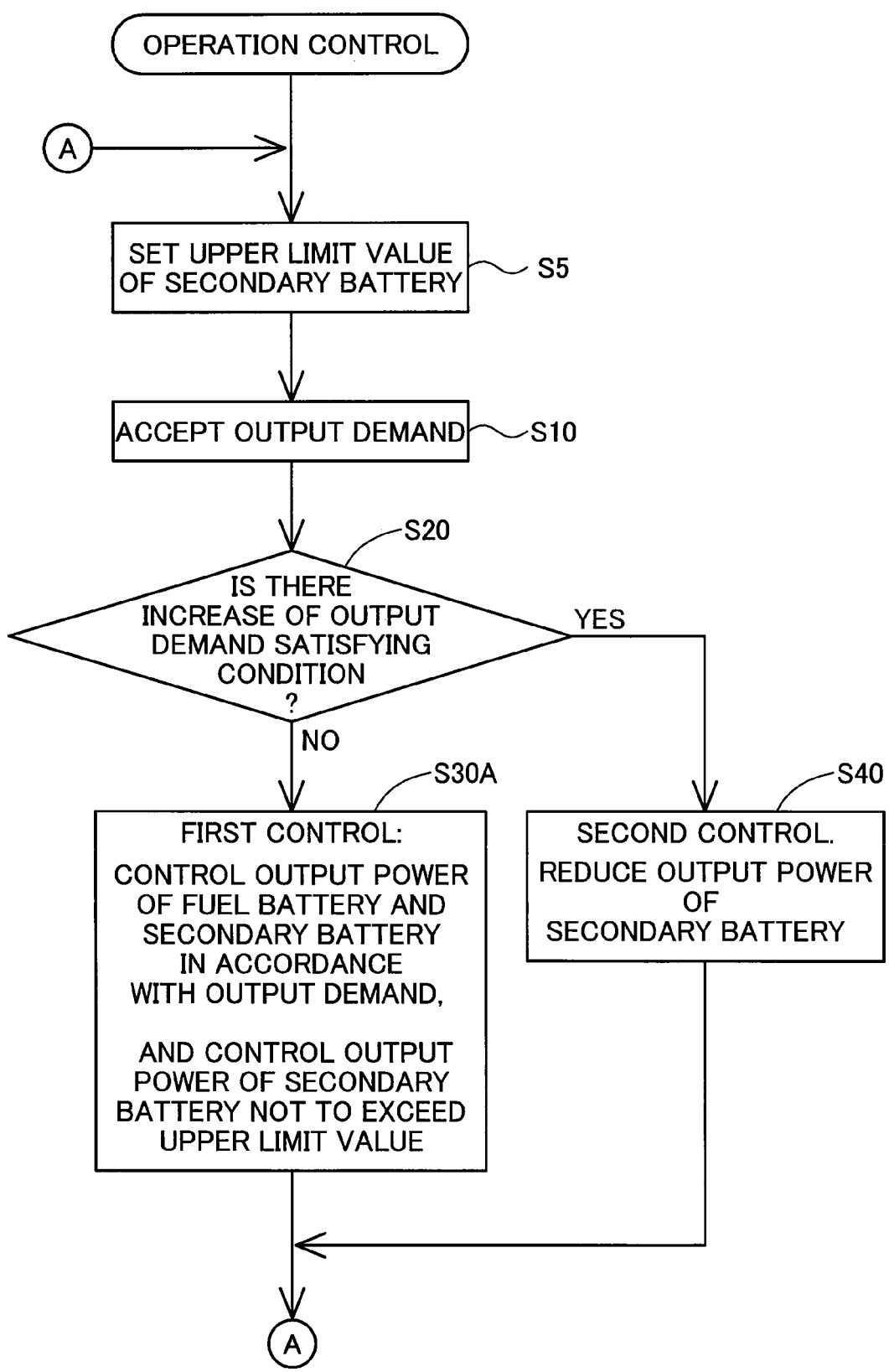
FIG. 7 is an explanatory diagram showing a flow of operation control in the fuel cell system of the second embodiment.

FIG. 7 is an explanatory diagram showing a flow of operation control performed by the controller 15 in the fuel cell system 10B of the second embodiment. The operation control of the second embodiment is almost the same as the operation control of the first embodiment shown in FIG. 2 except that the processing in step S5 is added and the control of the output power Wb of the secondary battery 30 in the first control is different.

In step S5, the controller 15 determines an upper limit value Wlim of the output power Wb of the secondary battery 30 during operation of the fuel cell 20. In the second embodiment, the controller 15 determines the upper limit value Wlim in accordance with information detected by the secondary battery state detection unit 35. The controller 15 uses a map prepared in advance to determine the upper limit value Wlim in accordance with a measurement value of current temperature of the secondary battery 30 and a measurement value of a current SOC of the secondary battery 30. In the map, a relationship is set with which the upper limit value Wlim is uniquely determined with respect to a combination of the current temperature of the secondary battery 30 and the current SOC of the secondary battery 30.

The upper limit value Wlim is used in the first control of step 30A. In the first control of the second embodiment, the controller 15 controls the output power Wb of the secondary battery 30 not to exceed the upper limit value Wlim even when the demand power Wr increases. In the first control of the second embodiment, for other features, similar control is performed as the control that has been described in the first embodiment.

Figure 8:
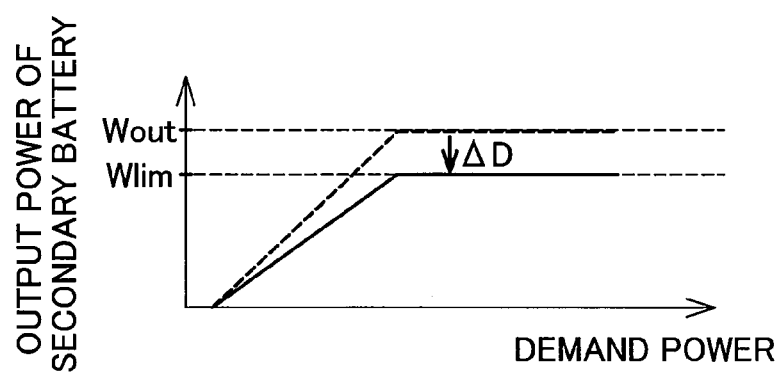
FIG. 8 is an explanatory diagram for explaining an upper limit value of the output power of the secondary battery.

The upper limit value Wlim of the output power Wb of the secondary battery 30 will be described with reference to FIG. 8. FIG. 8 is an explanatory diagram showing an example of a relationship between the demand power Wr and the output power Wb of the secondary battery 30 in the first control of the second embodiment.

The upper limit value Wlim is smaller value than the limit value Wout of the power that is able to be currently output of the secondary battery 30 that has been described in the first embodiment. As described in the first embodiment, the limit value Wout varies depending on the current temperature of the secondary battery 30 and the current SOC of the secondary battery 30. The map described above used in step S5 is set such that the upper limit value Wlim is obtained, the upper limit value Wlim having a value smaller for the amount of ΔD than the current limit value Wout obtained by the current temperature of the secondary battery 30 and the current SOC of the secondary battery 30.

ΔD may be a value determined in advance on the basis of experiment or the like, and desirably, at least a value corresponding to power consumed by auxiliary machines when the output power of the fuel cell 20 is increased. ΔD may be an average value of power consumed by auxiliary machines when the output power of the fuel cell 20 is increased within a predetermined voltage range. Note that the "auxiliary machines" here at least include an air compressor used for supplying oxidizing gas as will be described in a third embodiment described later.

According to the operation control of the second embodiment, in the first control, control is performed such that the output power Wb of the secondary battery 30 does not exceed the upper limit value Wlim that is changed in accordance with the current temperature or the current SOC of the secondary battery 30. Thus, in the first control, the output power Wb of the secondary battery 30 is prevented from reaching the limit value Wout that varies in accordance with the state of the secondary battery 30. According to the operation control of the second embodiment, switching from the first control to the second control is performed in a state where the secondary battery 30 has remaining power for the amount of ΔD that is a difference between the current limit value Wout and the upper limit value Wlim. Thus, even when the control is switched to the second control in a state where the output power Wb of the secondary battery 30 is close to the upper limit value Wlim, the power consumed in the auxiliary machines in order to increase the output power of the fuel cell 20 is able to be output from the secondary battery 30. Accordingly, response for the output demand is prevented from being delayed since the supply power for the auxiliary machines of the fuel cell 20 is insufficient and the output power of the fuel cell 20 is not able to be increased.

As described above, according to the fuel cell system 10B of the second embodiment, the output power of the fuel cell 20 is prevented from being unable to be increased since the output power Wb from the secondary battery 30 is not able to be obtained, and the power supplied to the auxiliary machines is insufficient. Accordingly, the response for the increase demand of the supply power from the external load OL is prevented from being delayed. Other than that, according to the fuel cell system 10B of the second embodiment and the control method realized in the operation control of the fuel cell system 10B, in addition to the operation and effects that have been described in the second embodiment, various operation and effects similar to those that have been described in the first embodiment is achieved.

3. THIRD EMBODIMENT

Figure 9:
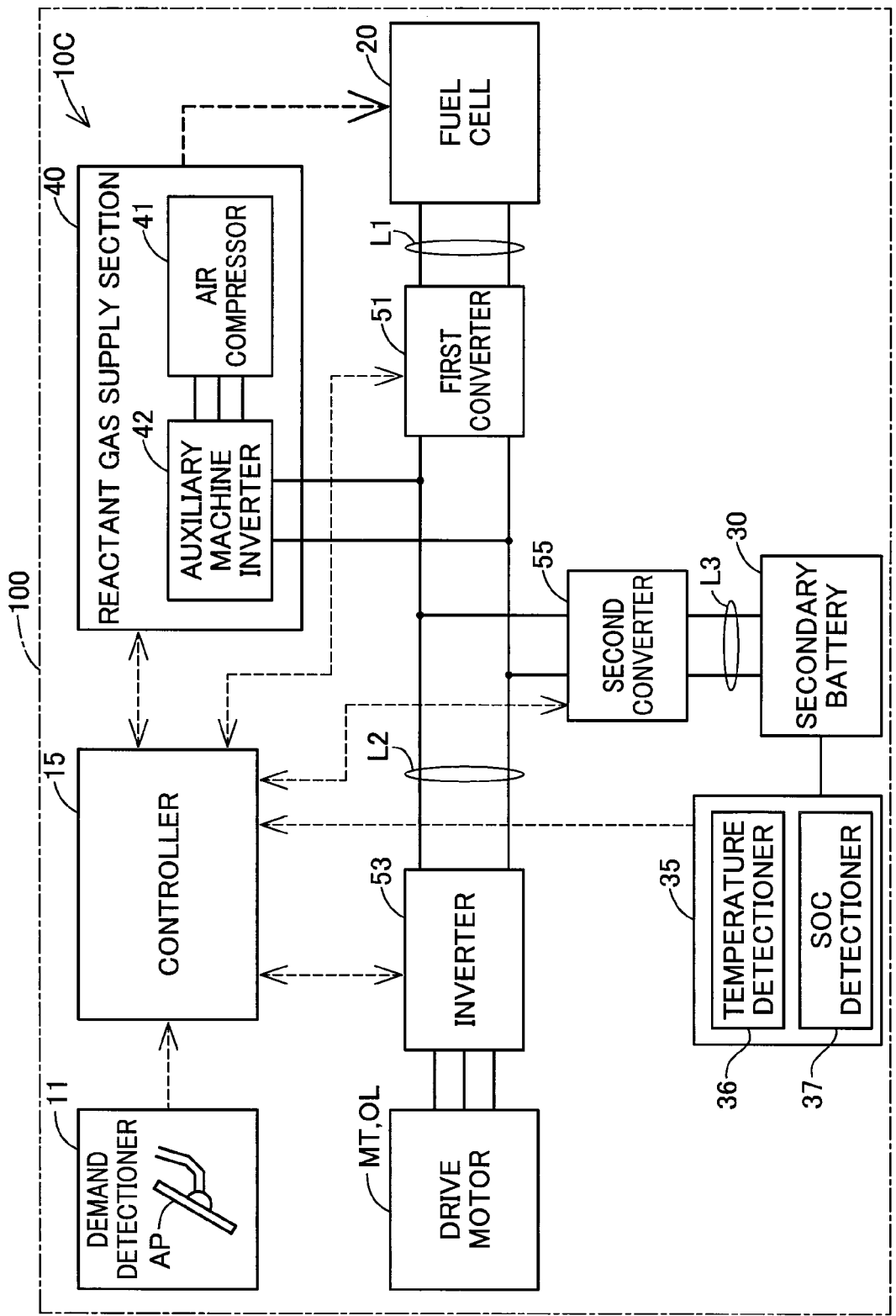
FIG. 9 is a schematic block diagram showing a configuration of a fuel cell system of a third embodiment.

FIG. 9 is a schematic block diagram showing a configuration of a fuel cell system 10C of a third embodiment. FIG. 9 illustrates the reactant gas supply system 40 that is not illustrated in FIG. 1 and FIG. 6. The configuration of the fuel cell system 10C of the third embodiment is substantially the same as the configuration of the fuel cell system 10B of the second embodiment.

The reactant gas supply system 40 supplies reactant gas to the fuel cell 20 under control of the controller 15. The reactant gas supply system 40 supplies oxygen included in outside air to the fuel cell 20 as oxidizing gas. The reactant gas supply system 40 includes an air compressor 41, and an auxiliary machine inverter 42. The air compressor 41 sends out compressed air compressed by taking in outside air, to the fuel cell 20. The air compressor 41 drives by a drive motor (not illustrated) configured with a three-phase AC motor.

The auxiliary machine inverter 42 converts a DC current to a three-phase AC current and supplies the converted current to the drive motor of the air compressor 41. The auxiliary inverter 42 is connected to the second wiring L2 in parallel with the inverter 53 connected to the motor MT. The controller 15 controls power to be supplied from the auxiliary inverter 42 to the drive motor of the air compressor 41 to adjust pressure and a flow rate of air to be supplied to the fuel cell 20. The reactant gas supply system 40 further includes, for example, a pressure regulator valve as a component for supplying oxidizing gas (not illustrated and not described in detail).

The reactant gas supply system 40 further supplies hydrogen as fuel gas. The reactant gas supply system 40 includes as components for supplying hydrogen, for example, a high pressure tank that stores hydrogen, an opening and closing valve that controls a flow of hydrogen, a pressure regulator valve that adjusts a pressure of hydrogen, an injector that adjusts a flow rate of hydrogen, and a pump that circulates hydrogen. Herein, for the convenience, illustration and detailed description of these components are omitted.

The operation control performed by the controller 15 in the fuel cell system 10C of the third embodiment is almost the same as the operation control of the second embodiment shown in FIG. 7 except that the method of setting the upper limit value Wlim of the output power Wb of the secondary battery 30 in the processing of step S5 is different.

In the third embodiment, in step S5, the controller 15 first uses a map prepared in advance to obtain the limit value Wout of the output power at the current time of the secondary battery 30 on the basis of information detected by the secondary battery state detection unit 35. In the map, a relationship is set with which the limit value Wout is uniquely determined with respect to a combination of the current temperature of the secondary battery 30 and the current SOC of the secondary battery 30. The controller 15 next uses a map MP described below to obtain estimated power necessary for increasing the output power of the fuel cell 20 from the current value, from the current rotation speed of the air compressor 41.

Figure 10:
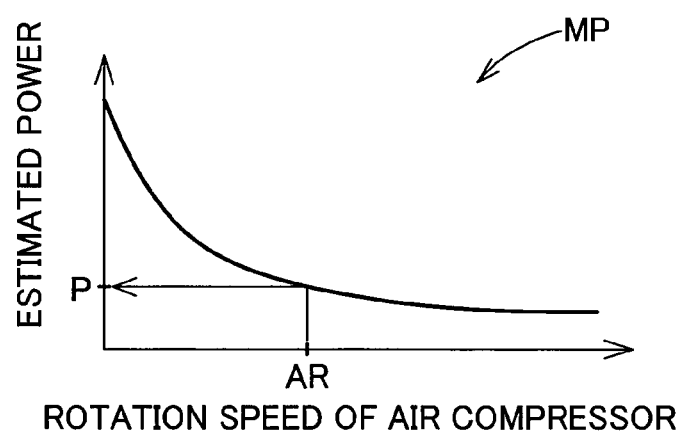
FIG. 10 is an explanatory diagram showing an example of a map for obtaining estimated power.

FIG. 10 is an explanatory diagram showing an example of the map MP for obtaining the estimated power P by the controller 15. In the map MP, a relationship is set in which the value of the estimated power P output is smaller as a rotation speed AR of the air compressor 41 is larger. In the example of this map MP, as the rotation speed AR of the air compressor 41 is larger, the value of the estimated power P decreases in an inversely proportional manner.

In general, in the power consumed for power generation control of the fuel cell 20, the ratio of the consuming power of the air compressor 41 is large. When the output power of the fuel cell 20 is increased, the rotation speed of the air compressor 41 is increased. The power consumed when the rotation speed of the air compressor 41 is smaller as the rotation speed of the air compressor 41 before the increase of the rotation speed is larger. Thus, a relationship as shown in FIG. 10 in which the value of the estimated power P is smaller as the rotation speed AR of the air compressor 41 is larger.

The controller 15 sets the value obtained by subtracting the estimated power P from the current limit value Wout as the upper limit value Wlim. The upper limit value Wlim is set to be larger value as the rotation speed of the air compressor 41 is larger. As similar to the control that has been described in the second embodiment, the controller 15 controls the output power Wb of the secondary battery 30 not to exceed the upper limit value Wlim in the first control of step S30A. According to such operation control, when the increase amount of the consuming power in the air compressor 41 when the control is switched to the second control and the output power of the fuel cell 20 is increase is small, the limitation for the output power Wb of the secondary battery 30 in the first control is relaxed.

According to the fuel cell system 10C of the third embodiment, an appropriate upper limit value Wlim is set in accordance with the power consumed for increasing the output power of the fuel cell 20 when the control is switched from the first control to the second control. Thus, the system efficiency is prevented from decreasing and the response of the fuel cell system 10C for the output demand is prevented from being delayed due to excessive limitation of the output power Wb of the secondary battery 30 in the first control. Other than that, according to the fuel cell system 10C of the third embodiment and the control method realized in the fuel cell system 10C, in addition to the operation and effects that have been described in the third embodiment, various operation and effects similar to those that have been described in the first embodiment and the second embodiment.

4. OTHER EMBODIMENTS

Various configurations described in each embodiment described above may be modified as below, for example. Each of the modifications described below is considered as an example of the embodiments for performing the technique of the present disclosure, as similar to each embodiment describe above.

4-1. Other Embodiment 1

The determination condition in step S20 for determining switching from the first control to the second control is not limited to the condition using both of the first condition and the second condition that has been described in each embodiment. As the determination condition in step S20, only one of the first condition and the second condition may be used. The determination condition of step S20 may be determined such that the control is switched from the first control to the second control when the supply power of a value more than a predetermined value is demanded continuously for longer period than a predetermined period. Otherwise, the determination condition may be determined such that the control is switched from the first control to the second control when the charging amount of the secondary battery 30 is lower than a predetermined threshold and the output demand demanding increasing of the supply power is detected.

4-2. Other Embodiment 2

In the second control of each embodiment described above, a configuration may be adopted in which the output power Wb of the secondary battery 30 is not decreased to 0. In the second control the control of further decreasing the output power Wb of the secondary battery 30 than when the control is switched from the first control, so that the load of the secondary battery 30 is decreased further than that in the first control. Thus, the effect that has been described in each embodiment described above is achieved.

4-3. Other Embodiment 3

In the second embodiment and the third embodiment, the secondary battery state detection unit 35 detects the current temperature of the secondary battery 30 and the current SOC of the secondary battery 30. On the other hand, a configuration may be adopted in which only the current temperature of the secondary battery 30 is detected. In this case, the upper limit value Wlim is changed in accordance with the current temperature of the secondary battery 30. Furthermore, a configuration may be adopted in which the secondary battery state detection unit 35 detects only the current SOC of the secondary battery 30. In this case, the upper limit value Wlim is changed in accordance with the current SOC of the secondary battery 30. The secondary battery state detection unit 35 may detect information representing the state of the secondary battery 30 other than the current temperature and the current SOC of the secondary battery 30 and transmit the information to the controller 15. The secondary battery state detection unit 35 may detect a current voltage of the secondary battery 30 and transmit the detection result to the controller 15. In this case, the upper limit value Wlim may be changed in accordance with the voltage of the current secondary battery 30.

4-4. Other Embodiment 4

In each embodiment described above, the fuel cell systems 10A to 10C may be applied to a moving body such as a vessel other than the vehicle 100, a facility such as a building, as a power supply source.

4-5. Other Embodiment 5

In the embodiments described above, the configuration realized by the map may be realized by a function formula or an operation formula with which an output result equal to that by the map is able to be obtained. The hardware for obtaining such an output result is not limited to a computer, and may be realized by various electronic circuits and operation devices. In the embodiments described above, a part or all of the functions and processing realized by the hardware may be realized by software. As the hardware, various circuits may be used, such as an integrated circuit, a discrete circuit, or a circuit module in which those circuits are combined, for example.

5. OTHER ASPECTS

The technique of the present disclosure is not limited to the embodiments, examples, and modifications described above, and may be implemented in various configurations without departing from the scope of the present disclosure. For example, the technical features in the embodiments, examples, and modification may be changed or combined as appropriate, in order to solve a part or all of the problem described above, or achieve a part or all of the effects described above. Technical features other than the features that are described in this specification as capable of being omitted may be deleted as appropriate, if the technical features are not described in this specification as essential. The present disclosure may be implemented by aspects described below.

A first aspect is provided as a fuel cell system that supplies power corresponding to an output demand to an external load. The fuel cell system comprising: a demand detector detecting the output demand; a fuel cell generating power by receiving of reactant gas supply and outputting generated power to the external load; a secondary battery outputting charged power to the external load; and a controller configured to perform a first control and a second control, wherein (i) the first control controls output power of the fuel cell and output power of the secondary battery such that the output power of the secondary battery has a ratio predetermined in accordance with the output demand, in the power supplied to the external load, (ii) the second control sets a target value of the output power of the fuel cell such that the output power of the secondary battery is smaller than that in the first control, and the controller is configured to switch the first control to the second control when the demand detector detects the output demand satisfying a predetermined condition with which the output power of the secondary battery is predicted to reach a limit value with the first control during performing of the first control.

According to the fuel cell system of this aspect, with the first control, the fuel cell system is able to achieve high efficiency by utilizing the output power of the secondary battery, in addition to the output power of the fuel cell. When increase of the output demand with which there is a possibility that the output power of the secondary battery reaches a limit value from which the output power is not able to increase anymore is detected in the first control, the controller switch the first control to the second control, and thereby, the load of the secondary battery is reduced in advance. Thus, even when the external load demands further increase of supply power thereafter, the output power of the secondary battery is prevented from reaching the limit value, and it is possible to prevent falling into a state where the output power of the secondary battery is not able to be used in increase of the supply power. Accordingly, the response for the increase demand of the supply power to the external load is prevented from being delayed more than when the secondary battery is able to assist the output power, since the output of the secondary battery reaches its limit.

In the fuel cell system according to the aspect described above, during performing of the first control, when the demand detector detects, as the output demand satisfying the predetermined condition, at least one of (a) the output demand with which the power corresponding to the output demand is larger than a predetermined first threshold, or (b) a change in the output demand with which an increase amount per a unit time of the power corresponding to the output demand is larger than a predetermined second threshold, the controller may switch the first control to the second control.

According to the fuel cell system of this aspect, in the first control, it is possible to detect increase of the output demand with which the output power of the secondary battery may reach the limit value.

In the fuel cell system of the aspect described above, the controller may be configured to control the output power of the secondary battery to decrease to 0 in the second control.

According to the fuel cell system of this aspect, a load of the secondary battery is significantly reduced in the second control. Thus, even when cell capacity of the secondary battery is small, the output power of the secondary battery is able to be prevented effectively from reaching the limit value.

In the fuel cell system of the aspect described above, the controller may be configured to determine an upper limit value of the output power of the secondary battery in accordance with the state of the secondary battery during operation of the fuel cell, and control the output power of the secondary battery not to exceed the upper limit value in the first control.

According to the fuel cell system of this aspect, an upper limit value is able to be determined such that the output power of the secondary battery does not reach the limit value in the first control. Accordingly, the secondary battery is able to maintain a state of having a margin to the output limit, and the secondary battery is prevented from becoming unable to cope with sudden increase demand of the supply power supplied to the external load, or the like.

The fuel cell system of the aspect described above may further include a temperature detector detecting temperature of the secondary battery, and the controller may determine the upper limit value in accordance with a measurement value of the temperature detector.

According to the fuel cell system of this aspect, the limit value of the output power of the secondary battery is prevented from decreasing due to a temperature state of the secondary battery, and the secondary battery is prevented from outputting the power close to the limit value. Thus, the output power of the secondary battery is effectively prevented from becoming unable to cope with the demand when the increase of the supply power is demanded.

The fuel cell system of the embodiment described above further includes a charging state detector detecting a state of charge of the secondary battery, and the controller may be configured to determine the upper limit value in accordance with the state of charge of the secondary battery.

According to the fuel cell system of this aspect, the secondary battery is prevented from outputting power close to the limit value even when the charging amount of the secondary battery decreases and the limit value of the secondary battery decreases. Thus, the output power of the secondary battery is effectively prevented from becoming unable to cope with the demand when increase of the supply power is demanded.

The fuel cell system of the aspect described above includes an air compressor supplying compressed air as the reactant gas to the fuel cell, and an auxiliary machine inverter controlling power supplied to the air compressor, and the controller may be configured to control rotation speed of the air compressor via the auxiliary machine inverter to increase the value of the upper limit value as the rotation speed of the air compressor is faster.

According to this fuel cell system of this aspect, as the power consumed by the air compressor when the output power of the fuel cell is increased is predicted to be smaller, the limitation for the output power of the secondary battery in the first control is relaxed more. Accordingly, the output power of the secondary battery is prevented from being limited excessively in the first control so that the system efficiency decreases.

A second aspect is provided as a vehicle. The vehicle of this aspect may include the fuel cell system described above, the external load may include a motor that generates a drive force of the vehicle, and the demand detector may include an accelerator that accepts an acceleration demand of the vehicle by a driver.

According to the vehicle of this aspect, a response for the increase demand of the power supplied to the motor is prevented from being delayed due to limitation of output characteristics at the current time of the secondary battery. Accordingly, torque generation in the motor is prevented from being delayed for operation by the driver so that the driver feels uncomfortable feeling.

A third aspect is provided as a control method of the fuel cell system of using the output power of the fuel cell and the output power of the secondary battery to supply the power corresponding to the output demand to the external load. The control method of this aspect includes steps of: performing first control of controlling the output power of the fuel cell and the output power of the secondary battery in accordance with the output demand such that the output power of the secondary battery has a ratio determined in advance in accordance with the output demand, in the power supplied to the external load, and during performing of the first control, when increase of the output demand satisfying a predetermined condition with which the output power of the secondary battery is predicted to reach a limit value is detected, switching the first control to a second control, the second control sets a target value of the output power of the fuel cell such that the output power of the secondary battery is decreased to be smaller than in the first control.

According to the control method of this aspect, when there is a possibility that the output power of the secondary battery reaches the limit value in the first control, a load of the secondary battery is reduced in advance by the second control. Accordingly, the output power of the secondary battery is prevented from reaching the limit value so that support by the output power of the secondary battery is not able to be obtained, and the response for the increase demand of the supply power supplied to the external load is delayed more than in the case where the secondary battery is able to assists the output power.

Not all the plurality of components included in the embodiments of the present disclosure described above are essential. In order to solve a part or all of the problem described above, or achieve a part or all of the effects described in this specification, a part of the plurality of components may be changed, deleted, and switched with new other component, and a part of limitation thereof may be deleted, as appropriate. In order to solve a part or all of the problem described above, or achieve a part or all of the effect described in this specification, a part or all of the technical features included in one embodiment of the present disclosure described above may be combined with a part or all of the technical features included in the other embodiment of the present disclosure described above to obtain an independent one embodiment of the present disclosure.

The technique of the present disclosure may be realized in various embodiments other than a fuel cell system, a vehicle including the fuel cell system, and a control method of the fuel cell system. For example, the technique of the present disclosure may be realized in embodiments such as a control device that controls a fuel cell system, a method of controlling output of a secondary battery, a control device of a secondary battery, a computer program that realizes the aforementioned control method, a non-temporary recording medium in which the computer program is recorded, or the like.

What is claimed is:

1. A fuel cell system that supplies power corresponding to an output demand to an external load, the fuel cell system comprising:
   a demand detector detecting the output demand;
   a fuel cell generating power by receiving of reactant gas supply and outputting generated power to the external load;
   a secondary battery outputting charged power to the external load; and
   a controller configured to perform a first control and a second control, wherein
   (i) the first control controls output power of the fuel cell and output power of the secondary battery such that the output power of the secondary battery has a ratio predetermined in accordance with the output demand, in the power supplied to the external load,
   (ii) the second control sets a target value of the output power of the fuel cell such that the output power of the secondary battery is smaller than that in the first control, and the controller is configured to switch the first control to the second control when the demand detector detects the output demand satisfying a predetermined condition with which the output power of the secondary battery is predicted to reach a limit value with the first control during performing of the first control.

2. The fuel cell system in accordance with claim 1, wherein,
during performing of the first control, when the demand detector detects, as the output demand satisfying the predetermined condition, at least one of (a) the output demand with which the power corresponding to the output demand is larger than a predetermined first threshold, or (b) a change in the output demand with which an increase amount per a unit time of the power corresponding to the output demand is larger than a predetermined second threshold, the controller switches the first control to the second control.

3. The fuel cell system in accordance with claim 1, wherein
the controller is configured to control the output power of the secondary battery to decrease to 0 in the second control.

4. The fuel cell system in accordance with claim 1, wherein
the controller is configured to determine an upper limit value of the output power of the secondary battery in accordance with a state of the secondary battery during operation of the fuel cell, and control the output power of the secondary battery not to exceed the upper limit value in the first control.

5. The fuel cell system in accordance with claim 4, further comprising a temperature detector detecting temperature of the secondary battery,
wherein the controller determines the upper limit value in accordance with a measurement value of the temperature detector.

6. The fuel cell system in accordance with claim 4, further comprising a charging state detector detecting a state of charge of the secondary battery,
wherein the controller is configured to determine the upper limit value in accordance with the state of charge of the secondary battery.

7. The fuel cell system in accordance with claim 4, further comprising:
an air compressor supplying compressed air as the reactant gas to the fuel cell; and
an auxiliary machine inverter controlling power supplied to the air compressor,
wherein the controller is configured to control rotation speed of the air compressor via the auxiliary machine inverter to increase a value of the upper limit value as the rotation speed of the air compressor is faster.

8. A vehicle comprising
the fuel cell system in accordance with claim 1,
wherein the external load comprises a motor that generates a drive force of the vehicle, and
the demand detector comprises an accelerator that accepts an acceleration demand of the vehicle by a driver.

9. A control method of a fuel cell system of using output power of a fuel cell and output power of a secondary battery to supply power corresponding to an output demand to an external load, the control method comprising steps of:
performing first control of controlling the output power of the fuel cell and the output power of the secondary battery in accordance with the output demand such that the output power of the secondary battery has a ratio determined in advance in accordance with the output demand, in the power supplied to the external load, and
during performing of the first control, when increase of the output demand satisfying a predetermined condition with which the output power of the secondary battery is predicted to reach a limit value is detected, switching the first control to a second control, the second control sets a target value of the output power of the fuel cell such that the output power of the secondary battery is decreased to be smaller than in the first control.

10. The fuel cell system in accordance with claim 1, wherein the output power of the secondary battery is controlled to decrease upon initiation of the second control.

11. The control method of a fuel cell system in accordance with claim 9, wherein the output power of the secondary battery is controlled to decrease upon initiation of the second control.

12. The fuel cell system in accordance with claim 1, wherein the predetermined condition comprises a condition that a supply of a value more than a predetermined value is demanded continuously for a longer period than a predetermined period.

13. The fuel cell system in accordance with claim 9, wherein the predetermined condition comprises a condition that a supply of a value more than a predetermined value is demanded continuously for a longer period than a predetermined period.

* * * * *